United States Patent
Mollier et al.

(10) Patent No.: US 11,125,788 B2
(45) Date of Patent: Sep. 21, 2021

(54) DEVICE AND METHOD FOR MONITORING A VOLTAGE OR A CURRENT, ASSOCIATED SYSTEM FOR MONITORING AN ELECTRICAL SWITCHBOARD, ELECTRICAL ENCLOSURE AND TRANSFORMER STATION

(71) Applicant: Schneider Electric Industries SAS, Rueil Malmaison (FR)

(72) Inventors: Christophe Mollier, Villeurbanne (FR); Maxime Gaillard, Laval (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 0 days.

(21) Appl. No.: 14/967,493

(22) Filed: Dec. 14, 2015

(65) Prior Publication Data

US 2016/0178674 A1     Jun. 23, 2016

(30) Foreign Application Priority Data

Dec. 22, 2014 (FR) ..................................... 14 63163

(51) Int. Cl.
| | |
|---|---|
| *G01R 19/25* | (2006.01) |
| *G01R 19/252* | (2006.01) |

(Continued)

(52) U.S. Cl.
CPC ....... *G01R 19/2513* (2013.01); *G01R 19/252* (2013.01); *G01R 19/2516* (2013.01); *G01R 21/133* (2013.01); *G01R 22/063* (2013.01)

(58) Field of Classification Search
CPC .......................... G01R 19/2513; G01R 19/252
See application file for complete search history.

(56) References Cited

U.S. PATENT DOCUMENTS

| | | | |
|---|---|---|---|
| 5,517,106 | A | 5/1996 | Longini |
| 5,995,911 | A | 11/1999 | Hart |

(Continued)

FOREIGN PATENT DOCUMENTS

| | | |
|---|---|---|
| AU | 2013206748 A1 | 1/2014 |
| AU | 2013254917 A1 | 5/2014 |

(Continued)

OTHER PUBLICATIONS

International Search Report dated Sep. 25, 2012 in PCT/EP2012/065160.

(Continued)

*Primary Examiner* — Matthew E. Gordon
(74) *Attorney, Agent, or Firm* — Oblon, McClelland, Maier & Neustadt, L.L.P.

(57) ABSTRACT

An electronic device for monitoring an electrical quantity out of a voltage and arc intensity relative to an alternating current flowing in an electrical conductor, includes a measurement module configured to measure at least one value of the electrical quantity, a wireless transceiver, and a transmission module linked to the wireless transceiver. The monitoring device furthermore includes a computation module configured to compute at least one parameter for monitoring the electrical quantity as a function of at least one measured value of the electrical quantity, each monitoring parameter being chosen from an angular phase of the electrical quantity and a modulus of the electrical quantity, the transmission module being configured to transmit, to another electronic device, a data message containing at least one computed monitoring parameter.

9 Claims, 8 Drawing Sheets

Figure 1:
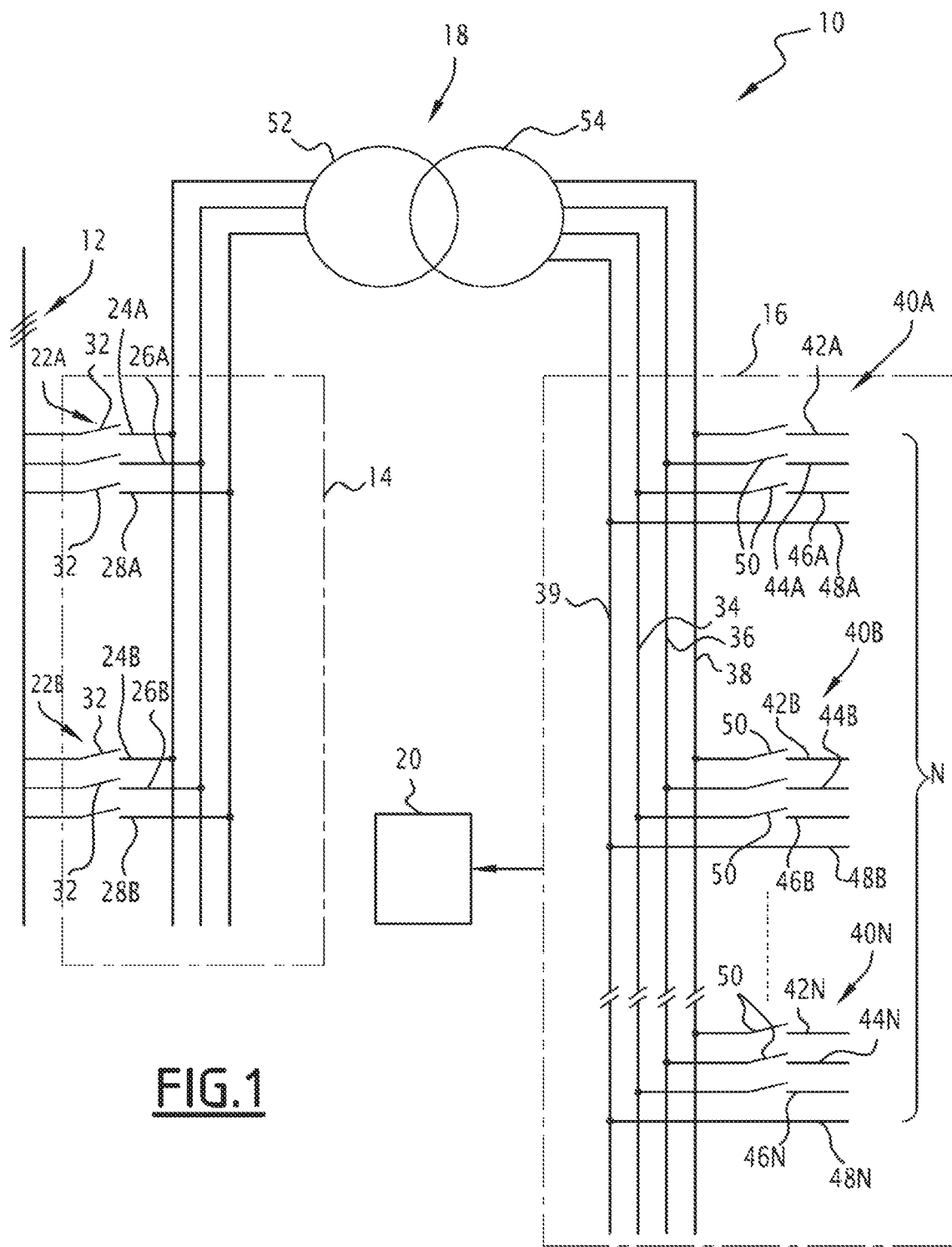

(51) Int. Cl.
*G01R 21/133* (2006.01)
*G01R 22/06* (2006.01)

(56) References Cited

U.S. PATENT DOCUMENTS

| | | | |
|---|---|---|---|
| 6,185,508 | B1 | 2/2001 | Van Doorn et al. |
| 6,236,949 | B1 | 5/2001 | Hart |
| 6,459,257 | B1 | 10/2002 | Köck |
| 6,734,658 | B1 | 5/2004 | Bierer |
| 7,109,699 | B1 | 9/2006 | Bierer |
| 8,014,964 | B1 | 9/2011 | Khalsa |
| 8,768,341 | B2 | 7/2014 | Coutelou et al. |
| 2005/0083206 | A1 | 4/2005 | Couch et al. |
| 2005/0222784 | A1 | 10/2005 | Tuff et al. |
| 2007/0038394 | A1 | 2/2007 | Gagnon et al. |
| 2010/0179779 | A1* | 7/2010 | Taft .................. G01R 19/2513 702/64 |
| 2011/0010118 | A1 | 1/2011 | Gaarder |
| 2011/0196629 | A1 | 8/2011 | Coutelou et al. |
| 2012/0089356 | A1 | 4/2012 | Taft |
| 2014/0239941 | A1 | 8/2014 | Coutelou et al. |
| 2014/0368351 | A1 | 12/2014 | Coutelou et al. |
| 2015/0142354 | A1 | 5/2015 | Coutelou et al. |

FOREIGN PATENT DOCUMENTS

| | | | | |
|---|---|---|---|---|
| DE | 197 38 140 | A1 | 3/1999 | |
| EP | 0 454 360 | A1 | 10/1991 | |
| EP | 2 354 799 | A1 | 8/2011 | |
| EP | 2 549 280 | A1 | 1/2013 | |
| EP | 2 685 267 | A1 | 1/2014 | |
| EP | 2 730 929 | A1 | 5/2014 | |
| EP | 2 873 981 | A1 | 5/2015 | |
| FR | 2 991 057 | A1 | 11/2013 | |
| FR | 2991057 | A1 * | 11/2013 | ........... G01R 21/133 |
| FR | 3 007 143 | A1 | 12/2014 | |
| GB | 2 452 989 | A | 3/2009 | |
| WO | WO 2009/037163 | A2 | 3/2009 | |
| WO | WO 2009/124833 | A1 | 10/2009 | |
| WO | WO 2009/140777 | A1 | 11/2009 | |
| WO | WO 2010/083164 | A2 | 7/2010 | |
| WO | WO 2013/017663 | A1 | 2/2013 | |

OTHER PUBLICATIONS

French Preliminary Search Report dated May 9, 2014 in French Application 1355657, filed on Jun. 17, 2013 (with English Translation of Categories of Cited Documents).

French Preliminary Search Report dated Jul. 17, 2014 in French Application 1361222, filed on Nov. 15, 2013 (with English Translation of categories of Cited Documents and Written Opinion).

French Preliminary Search Report dated Nov. 18, 2015 in French Application 14 63163, filed Dec. 22, 2014 (with English Translation of Categories of Cited Documents).

* cited by examiner

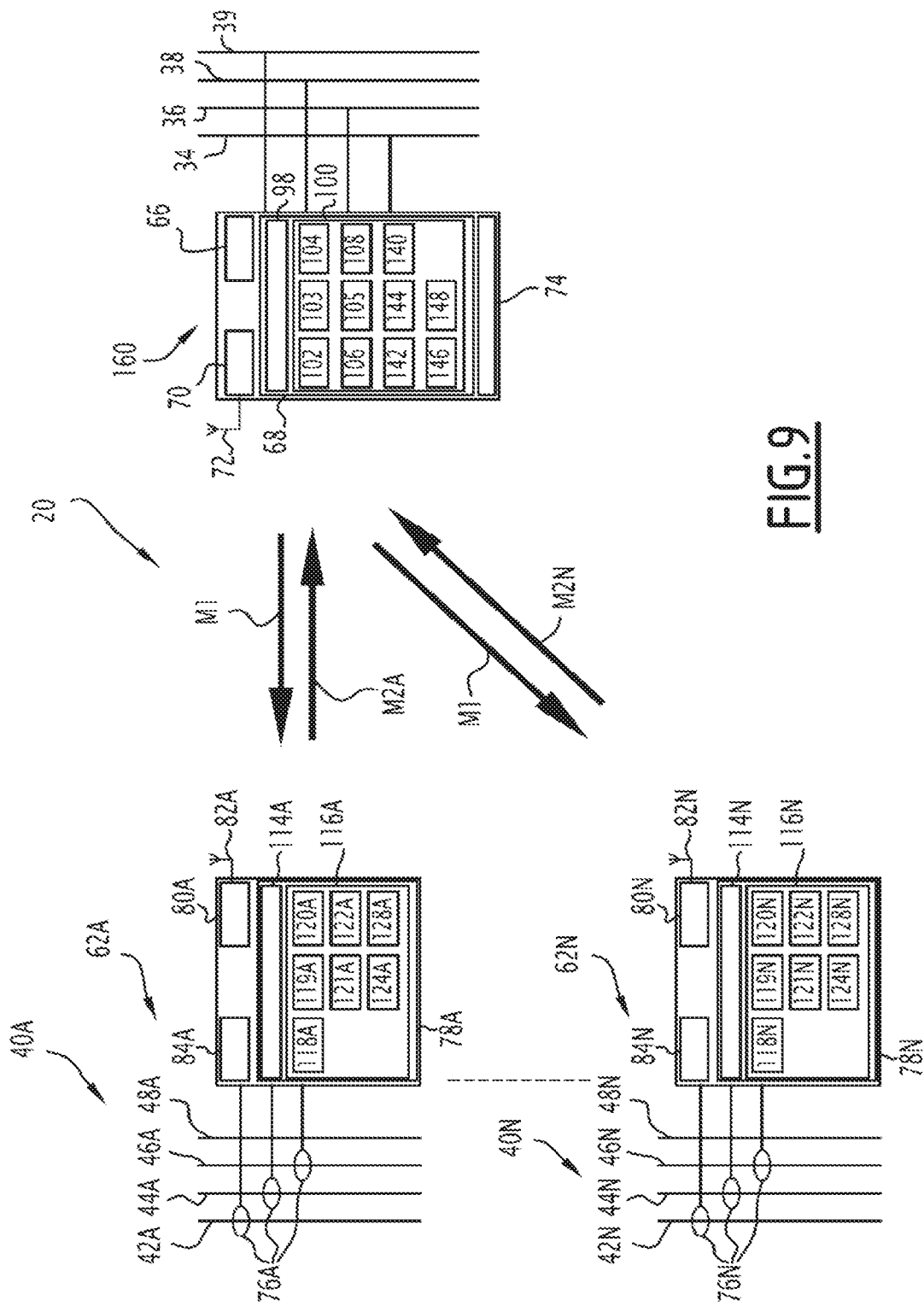

DEVICE AND METHOD FOR MONITORING A VOLTAGE OR A CURRENT, ASSOCIATED SYSTEM FOR MONITORING AN ELECTRICAL SWITCHBOARD, ELECTRICAL ENCLOSURE AND TRANSFORMER STATION

The present invention relates to an electronic device for monitoring an electrical quantity out of a voltage and an intensity relative to an alternating current flowing in an electrical conductor, the alternating current comprising at least one phase.

The monitoring device comprises a measurement module configured to measure at least one value of the electrical quantity, a wireless transceiver, and a transmission module linked to the wireless transceiver.

The present invention relates also to an electronic system for monitoring an electrical switchboard comprising at least one primary outgoing electrical conductor and at least one secondary outgoing electrical conductor, each secondary outgoing conductor being electrically connected to a corresponding primary outgoing conductor.

The monitoring system comprises such monitoring devices, namely a first electronic device for monitoring the voltage of each primary outgoing electrical conductor, and at least one second electronic device for monitoring the intensity of the alternating current flowing in each secondary electrical conductor.

The present invention relates also to an electrical enclosure comprising an electrical switchboard comprising outgoing electrical conductors, and such a monitoring system.

The present invention relates also to a substation for transforming an electrical current exhibiting a first alternating voltage into an electrical current exhibiting a second alternating voltage, this transformer substation comprising such an electrical enclosure, an incoming switchboard comprising at least one incoming electrical conductor designed to be linked to an electrical network, the incoming conductor exhibiting the first alternating voltage, the switchboard of the enclosure forming an outgoing switchboard in which the corresponding outgoing conductors exhibit the second alternating voltage. The transformer substation further comprises an electrical transformer connected between the incoming switchboard and the outgoing switchboard, the transformer being designed to transform the current exhibiting the first alternating voltage into the current exhibiting the second alternating voltage.

The present invention relates also to a method for monitoring an electrical quantity out of a voltage and an intensity relative to an alternating current flowing in an electrical conductor.

A monitoring system of the abovementioned type is known from the document WO 2013/017663 A1. This monitoring system makes it possible in particular to measure the electrical energy of the current flowing in secondary conductors linked to a primary conductor, the secondary conductors corresponding to outgoing conductors of an outgoing switchboard and exhibiting substantially the same voltage as the primary conductor. The primary module forms a device for monitoring the voltage of the primary conductor, and each secondary module forms a device for monitoring the intensity of the current flowing in the corresponding secondary conductor.

The primary module regularly measures the voltage of the primary conductor, then regularly transmits a first message containing a synchronization datum, as well as the measured values of said voltage. Each secondary module is then synchronized using the received synchronization datum; measures, synchronously with the primary module, the intensity of the current flowing in the corresponding secondary conductor; then computes the energy of the current flowing in said secondary conductor using the measured intensity values and voltage values contained in the first message. Each secondary module then sends, to a centralization module and according to a distributed token mechanism between the secondary modules, a second message containing the identifier of the corresponding secondary module and the energy computed by the secondary module, for example in the form of different energy meter values.

However, the measurement of the intensity, then the computation of the energy, are relatively high electrical energy consumers, and this imposes certain operating limitations on such a monitoring system, all the more so as each secondary module is self-powered from a toroid arranged around the corresponding secondary conductor.

The aim of the invention is to propose devices for monitoring the voltage, and respectively the intensity, of an alternating current flowing in an electrical conductor, and a monitoring system comprising such devices, that make it possible to remedy the abovementioned problem.

To this end, the subject of the invention is an electronic monitoring device of the abovementioned type, in which the monitoring device further comprises a computation module configured to compute at least one parameter for monitoring the electrical quantity as a function of at least one measured value of said electrical quantity, each monitoring parameter being chosen from an angular phase of the electrical quantity and a modulus of the electrical quantity, the transmission module being configured to transmit, to another electronic device, a data message containing at least one computed monitoring parameter.

According to other advantageous aspects of the invention, the electronic monitoring device comprises one or more of the following features, taken in isolation or according to all technically possible combinations:

the computation module is configured to compute the angular phase of the electrical quantity, for the or each phase of index i, according to the equation:

$$\varphi_{i,j,k}(X) = \arctan\left(\frac{\mathrm{Im}X_{i,j,k}}{\mathrm{Re}X_{i,j,k}}\right)$$

in which $\mathrm{Re}X_{i,j,k}$, $\mathrm{Im}X_{i,j,k}$ represent real and imaginary coefficients of a Fourier series decomposition of the electrical quantity, i is the index of the corresponding phase, j is the rank of the harmonic for the Fourier series decomposition, the fundamental being of rank equal to 1, and k is an index of a voltage period $P_{voltage}$ during which the value of the electrical quantity (X) is measured;

the computation module is configured to compute the modulus of the electrical quantity, for the or each phase of index i, according to the equation:

$$\|X_{i,j,k}\| = \sqrt{\frac{(\mathrm{Re}X_{i,j,k})^2 + (\mathrm{Im}X_{i,j,k})^2}{2}}$$

in which $\text{ReX}_{i,j,k}$, $\text{ImX}_{i,j,k}$ represent real and imaginary coefficients of a Fourier series decomposition of the electrical quantity, i is the index of the corresponding phase, j is the rank of the harmonic for the Fourier series decomposition, the fundamental being of rank equal to 1, and k is an index of a voltage period $P_{voltage}$ during which the value of the electrical quantity (X) is measured; and the device further comprises a module for sampling the value of the measured electrical quantity according to a sampling period.

Also the subject of the invention is an electronic system for monitoring an electrical switchboard comprising at least one primary outgoing electrical conductor and at least one secondary outgoing electrical conductor, the or each secondary outgoing conductor being electrically connected to a corresponding primary outgoing conductor, the corresponding outgoing conductors exhibiting an alternating voltage, the system comprising:

a first electronic device for monitoring the voltage of each primary outgoing electrical conductor, at least one second electronic device for monitoring the intensity of the alternating current flowing in each secondary electrical conductor, in which each electronic monitoring device is as defined above.

According to other advantageous aspects of the invention, the electronic monitoring system comprises one or more of the following features, taken in isolation or according to all technically possible combinations:

the measurement module of the first monitoring device is configured to also measure the frequency of the voltage, and the message transmitted by the transmission module of the first monitoring device further contains a measured value of the frequency;

each second monitoring device further comprises a module for sampling the value of the measured intensity according to a sampling period and a module for receiving the message transmitted by the transmission module of the first monitoring device, the reception module being linked to the wireless transceiver, and in which the value of the sampling period is a function of the measured value of the frequency of the voltage, contained in the last message received from the transmission module of the first monitoring device;

the system further comprises a centralizing electronic device configured to receive the data messages transmitted by the first monitoring device and by each second monitoring device, the centralizing electronic device being further configured to compute the electrical energy of the alternating current flowing in each secondary electrical conductor from the monitoring parameters computed by the first monitoring device and by each second monitoring device, these computed monitoring parameters being contained in the data messages received; and the first monitoring device further comprises a module for receiving the message transmitted by the transmission module of each second monitoring device, the computation module of the first monitoring device being further configured to compute the electrical energy of the alternating current flowing in each secondary electrical conductor from the monitoring parameters computed by it and by each second monitoring device, the monitoring parameters computed by each second monitoring device being contained in the data messages received by said reception module.

Also the subject of the invention is an electrical enclosure comprising:

a switchboard comprising at least one primary outgoing electrical conductor and at least one secondary outgoing electrical conductor, the or each secondary outgoing conductor being electrically connected to a corresponding primary outgoing conductor, the current flowing in the corresponding outgoing conductors exhibiting an alternating voltage, and a system for monitoring the electrical switchboard, in which the monitoring system is as defined above.

Also the subject of the invention is a substation for transforming an electrical current exhibiting a first alternating voltage into an electrical current exhibiting a second alternating voltage, comprising an electrical enclosure as defined above, an incoming switchboard comprising at least one incoming electrical conductor designed to be linked to an electrical network, the incoming conductor exhibiting the first alternating voltage, the switchboard of the enclosure forming an outgoing switchboard in which the corresponding outgoing conductors exhibit the second alternating voltage, and an electrical transformer connected between the incoming switchboard and the outgoing switchboard, the transformer being designed to transform the current exhibiting the first alternating voltage into the current exhibiting the second alternating voltage.

Also the subject of the invention is a method for monitoring an electrical quantity out of a voltage and an intensity relative to an alternating current flowing in an electrical conductor, the alternating current comprising at least one phase, the method being implemented by an electronic monitoring device, and comprising the following steps:

a) the measurement of at least one value of the electrical quantity, c) the transmission of a data message to another electronic device, in which the method further comprises, after the step a) and prior to the step c), the following step:

b) the computation of at least one parameter for monitoring the electrical quantity as a function of at least one measured value of said electrical quantity, each monitoring parameter being chosen from an angular phase of the electrical quantity and a modulus of the electrical quantity, the transmitted data message containing at least one computed monitoring parameter.

Figure 2:
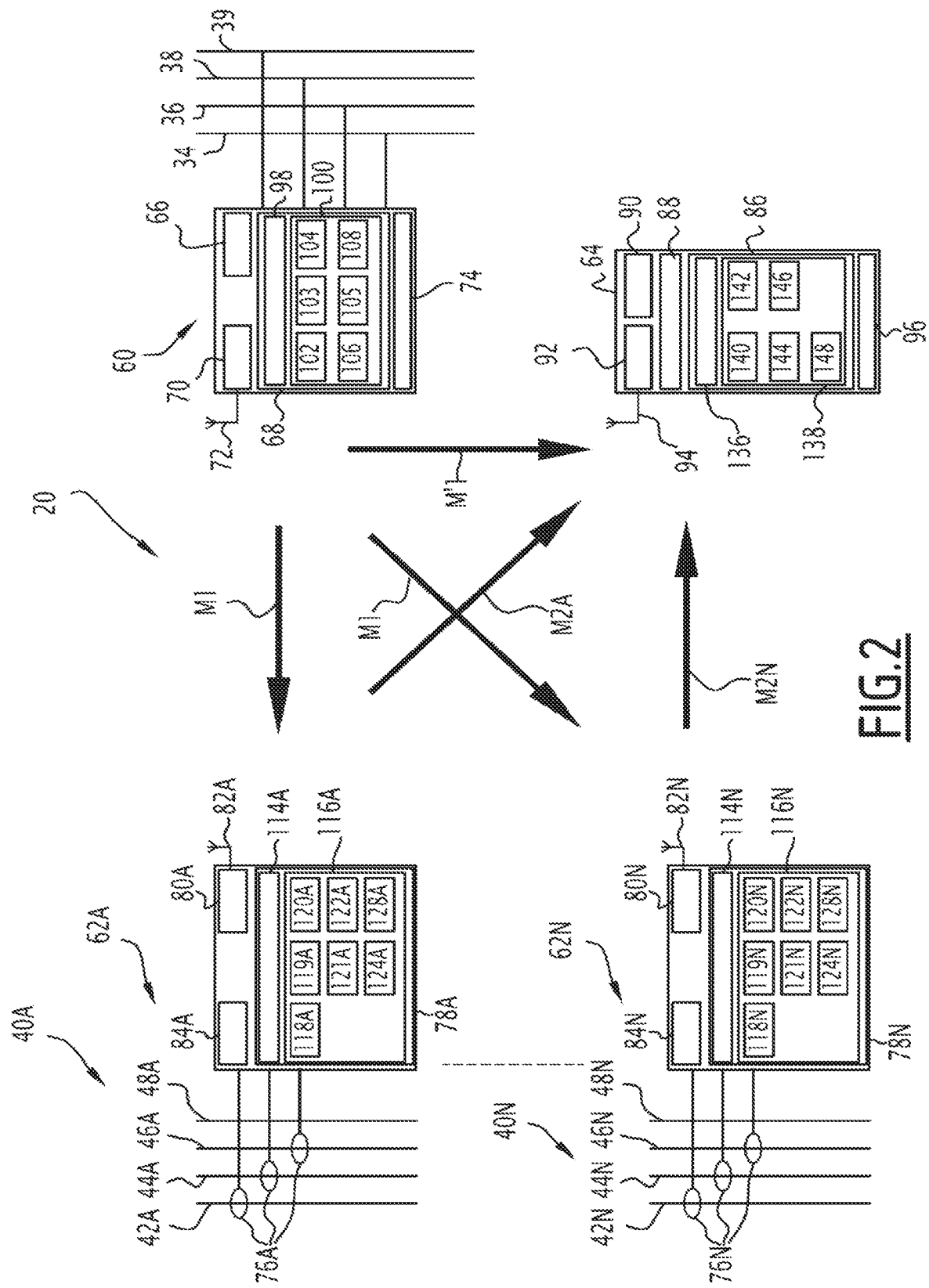
Figure 3:
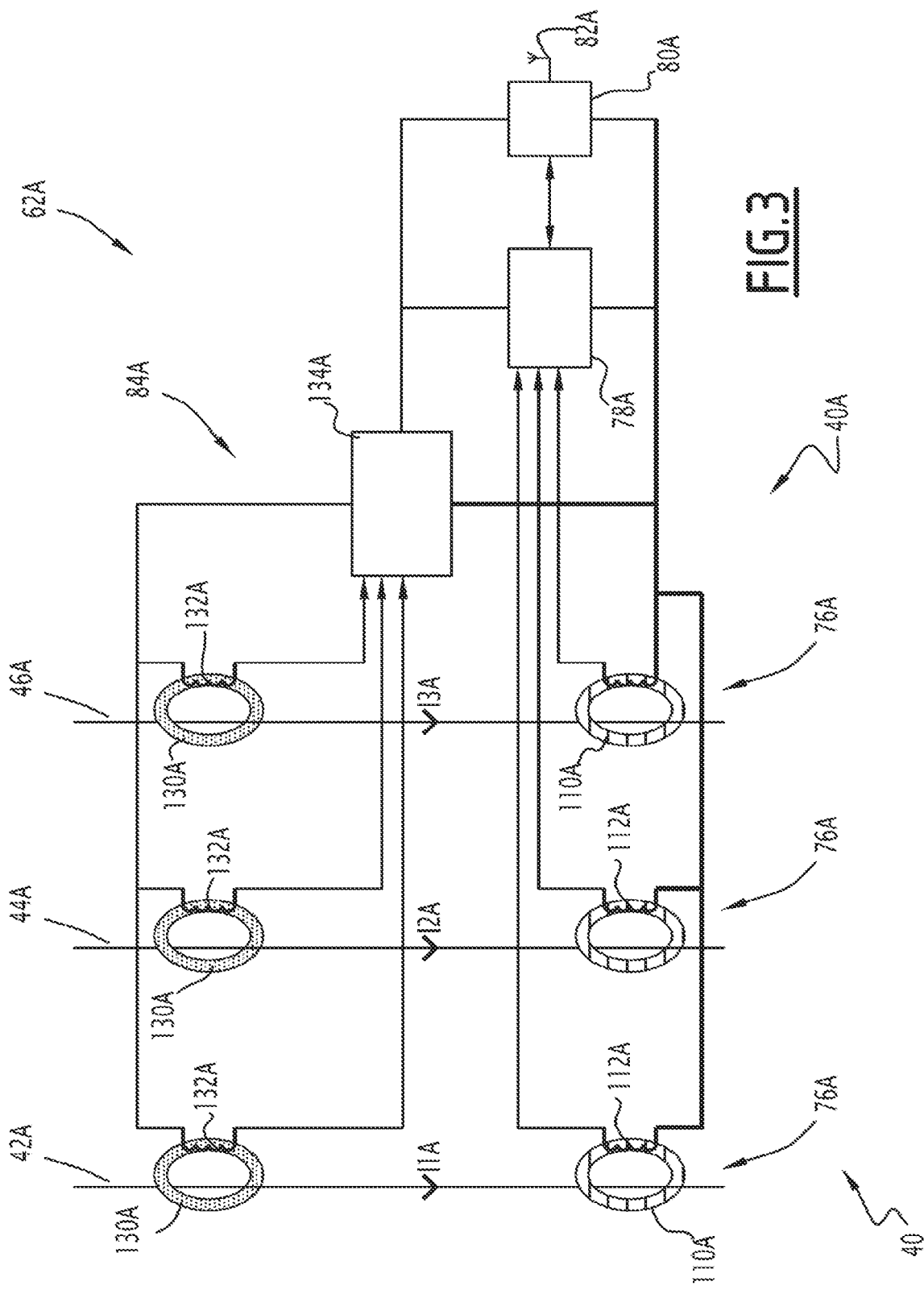
Figure 4:
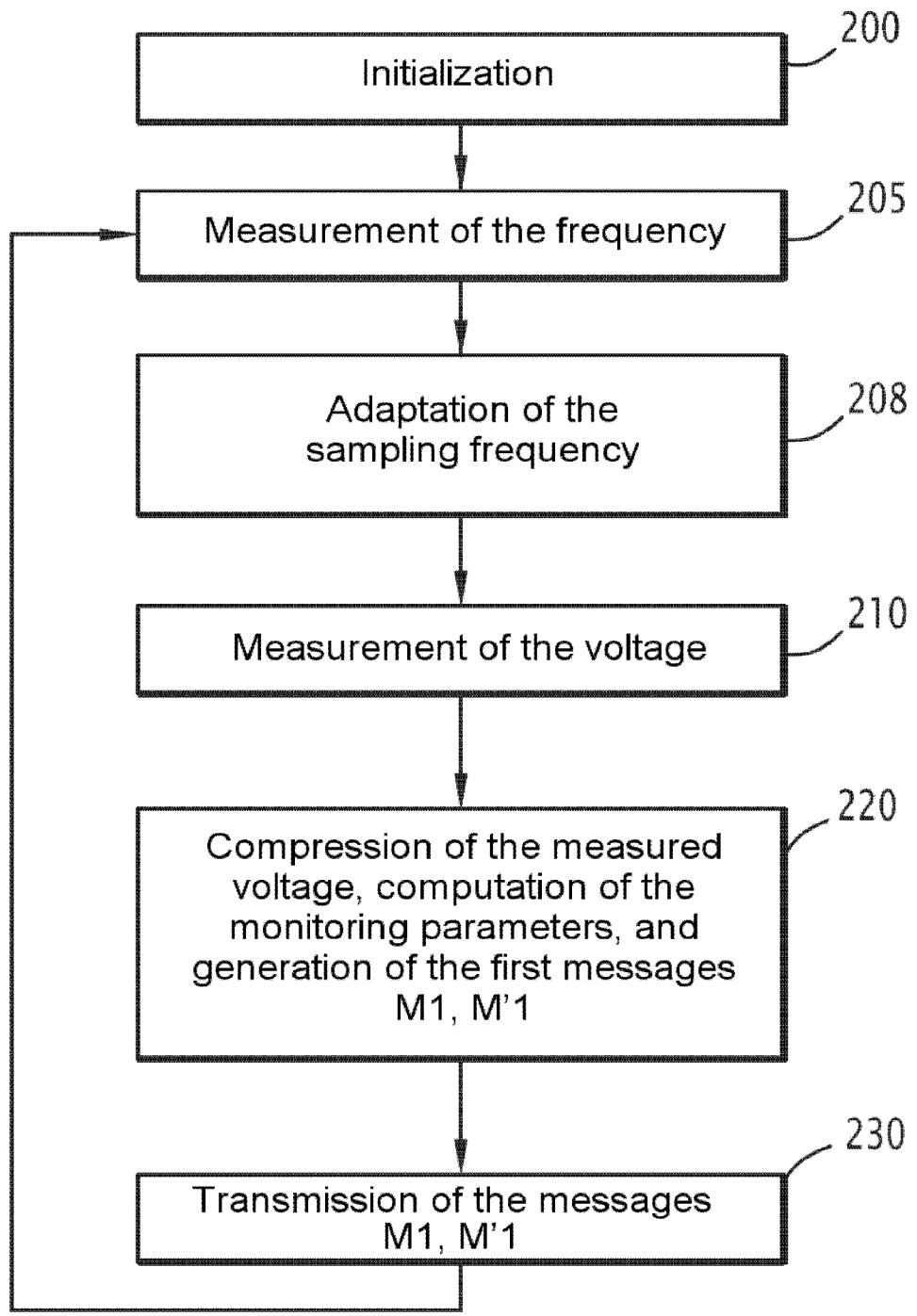
Figure 5:
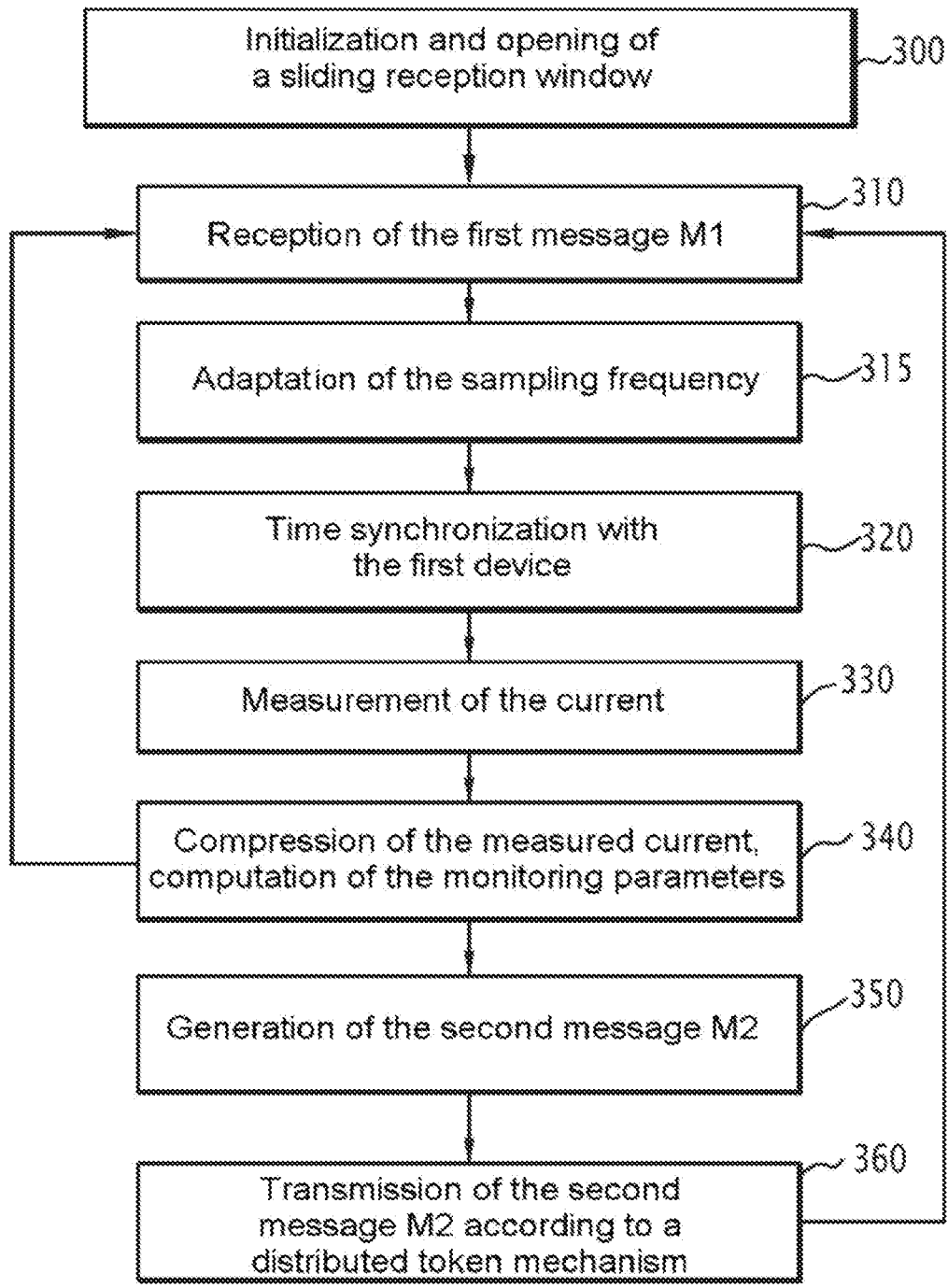
Figure 6:
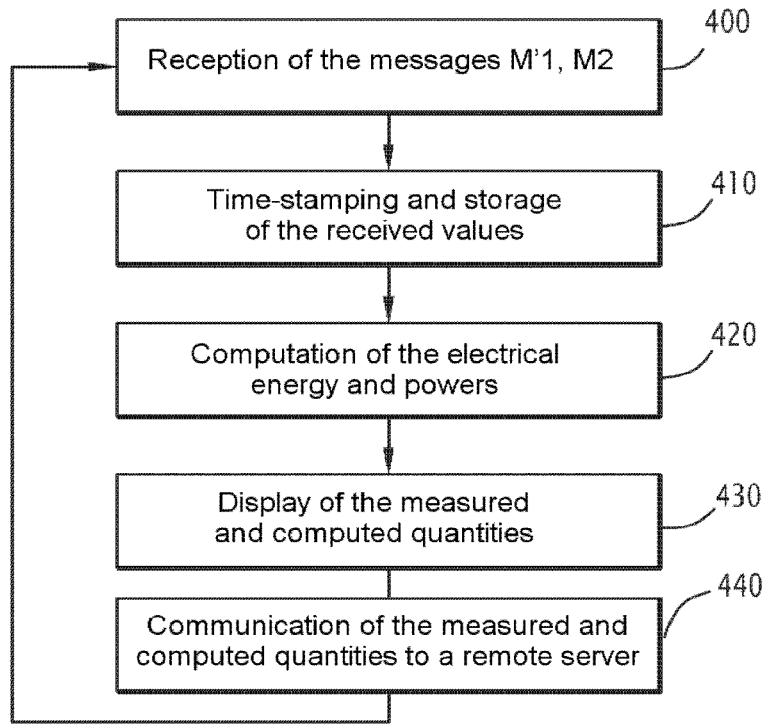
Figure 7:
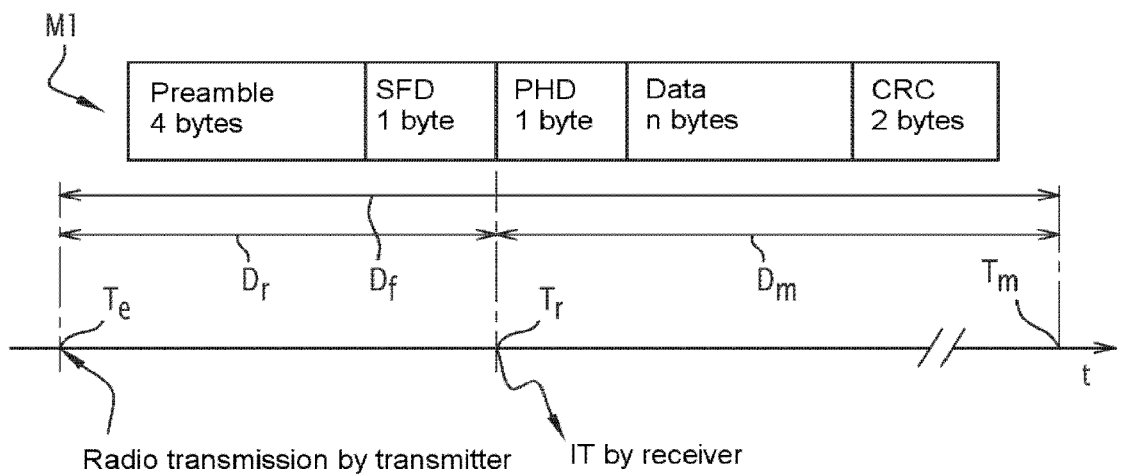
Figure 8:
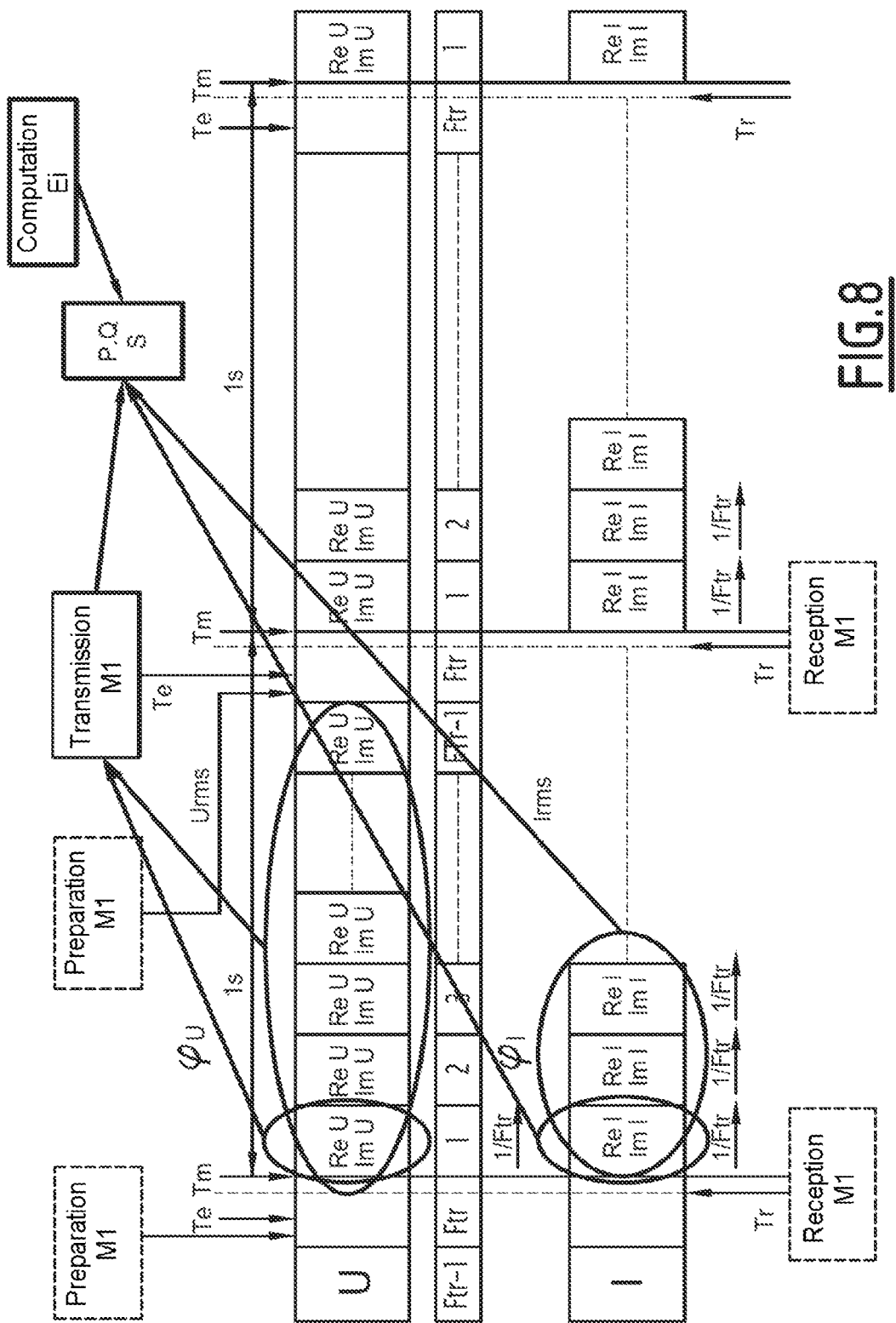

These features and advantages of the invention will become apparent on reading the following description, given purely as a nonlimiting example, and with reference to the attached drawings, in which:

FIG. 1 is a schematic representation of a transformer substation comprising a first switchboard, a second switchboard connected to the first switchboard via a transformer and a system for monitoring the second switchboard, FIG. 2 is a schematic representation of the monitoring system of FIG. 1 according to a first embodiment, the monitoring system comprising a first device for monitoring the voltage, a plurality of second devices for monitoring the intensity and a centralizing device, FIG. 3 is a schematic representation of the second device of FIG. 2, FIG. 4 is a flow diagram of the steps of a monitoring method according to the invention, implemented by the first device of FIG. 2, FIG. 5 is a flow diagram of the steps of the same monitoring method, implemented by the second devices of FIGS. 2 and 3, FIG. 6 is a flow diagram of the steps of the same monitoring method, implemented by the centralizing device of FIG. 2, FIG. 7 is a timing diagram representing the instants of transmission and of reception of a first message, the latter being transmitted by the first device to second devices, FIG. 8 is a timing diagram representing the time periods for which coefficients of a Fourier series decomposition of the voltage, and respectively of the intensity, are determined, and also the time instants of preparation of the first message, of transmission of the first message and of computation of the electrical energy, and FIG. 9 is a view similar to that of FIG. 2 according to a second embodiment.

Hereinafter in the description, the expression "substantially equal to" defines a relationship of equality to plus or minus 10%, preferably to plus or minus 5%.

In FIG. 1, a transformer substation 10 connected to an electrical network 12 comprises a first switchboard 14, also called incoming switchboard, a second switchboard 16, also called outgoing switchboard, an electrical transformer 18 connected between the first switchboard and the second switchboard and a system 20 for monitoring the second switchboard.

As a variant, an electrical enclosure, not represented, comprises the second switchboard 16 and the monitoring system 20. In other words, the electrical enclosure comprises the elements of the transformer substation 10 apart from the electrical transformer 18 and the first switchboard 14, the second switchboard 16 being for example powered directly at low voltage.

The transformer substation 10 is designed to transform the electrical current delivered by the network 12 and exhibiting a first alternating voltage, into an electrical current exhibiting a second alternating voltage.

The electrical network 12 is an alternating network, such as a three-phase network. The electrical network 12 is, for example, a medium voltage network, that is to say of a voltage greater than 1 000 V and less than 50 000 V. The first three-phase voltage is then a medium voltage. As a variant, the electrical network 12 is a high-voltage network, that is to say of a voltage greater than 50 000 V.

The first switchboard 14 comprises a number of incomers 22, each incomer 22 comprising first 24A, 24B, second 26A, 26B, and third 28A, 28B incoming conductors. Each first, second, third incoming conductor 24A, 24B, 26A, 26B, 28A, 28B is linked to the electrical network via a respective incoming circuit breaker 32. The three-phase current flowing in the corresponding incoming conductors 24A, 24B, 26A, 26B, 28A, 28B exhibits the first three-phase voltage.

The second switchboard 16 comprises a first 34, a second 36, a third 38 and a fourth 39 primary conductor and a plurality N of outgoers 40A, 40B, ... 40N, namely a first outgoer 40A, a second outgoer 40B, ..., an Nth outgoer 40N, each outgoer 40A, 40B, ..., 40N being designed to deliver a three-phase voltage.

Each outgoer 40A, 40B, ..., 40N is a low-voltage outgoer, that is to say of a voltage less than 1 000 V. The second three-phase voltage is then a low voltage. As a variant, each outgoer 40A, 40B, ..., 40N is a medium-voltage outgoer, that is to say of a voltage greater than 1 000 V and less than 50 000 V.

The first outgoer 40A comprises a first 42A, a second 44A, a third 46A and a fourth 48A secondary conductors and three outgoing circuit breakers 50. The first, second and third secondary conductors 42A, 42B, 42C are respectively linked to the first, second and third primary conductors 34, 36, 38 via a corresponding outgoing circuit breaker 50. The fourth secondary conductor 48A is directly connected to the fourth primary conductor 39.

The primary outgoing conductors 34, 36, 38 and the corresponding secondary outgoing conductors 42A, 44A, 46A exhibit substantially the same voltage, namely, respectively, a first voltage U1, a second voltage U2 and a third voltage U3 corresponding to the three phases of the second three-phase voltage.

The other outgoers 40B, ... 40N are identical to the first outgoer 40A described previously, and comprise the same elements, each time replacing the letter A by the corresponding letter B, N concerning the references of the elements.

The electrical transformer 18 is designed to transform the current from the electrical network exhibiting the first alternating voltage into the current delivered to the second switchboard 16 and exhibiting the second alternating voltage. The electrical transformer 18 comprises a primary winding 52 connected to the first switchboard 14 and a secondary winding 54 connected to the second switchboard 16.

The monitoring system 20 is configured to monitor the second switchboard 16, notably to compute the electrical energy of the current flowing in the or each secondary outgoing conductor 42A, 44A, 46A, 42B, 44B, 46B, ..., 42N, 44N, 46N.

The monitoring system 20, visible in FIG. 2, comprises a first electronic device 60 for monitoring the voltage U1, U2, U3 of each primary outgoing electrical conductor 34, 36, 38, a plurality N of second electronic devices 62A, 62B, ..., 62N for monitoring the intensity I1A, ..., I3N of the alternating current flowing in each secondary electrical conductor 42A, ..., 46N, and a centralizing electronic device 64.

The first device 60 comprises a module 66 for measuring the voltage of the current flowing in the corresponding primary conductor 34, 36, 38 and an information processing unit 68. The first device 60 also comprises a wireless transceiver 70, a wireless antenna 72, and an electrical power supply module 74 for the measurement module, for the information processing unit and for the wireless transceiver.

The second device with the reference 62A comprises, for each of the first 42A, second 44A and third 46A secondary conductors, a sensor 76A of the intensity of the current flowing in the corresponding secondary conductor 42A, 44A, 46A. The second device 62A comprises an information processing unit 78A, a wireless transceiver 80A, and a wireless antenna 82A. The second device 62A also comprises an electrical power supply module 84A for the information processing unit and for the wireless transceiver. The second device 62A is identified by a unique number, also called identifier.

The other second devices 62B, ..., 62N are identical to the second device 62A described previously, and comprise the same elements, each time replacing the letter A with the corresponding letter B, ..., N concerning the references of the elements. Each of the other second devices 62B, ..., 62N also has a unique identifier.

The centralizing device 64 comprises an information processing unit 86, a database 88 and a human-machine interface 90. The centralizing device 64 comprises a wireless transceiver 92, a wireless antenna 94 and an electrical power supply module 96 for the information processing unit, the database, the human-machine interface and the wireless transceiver.

The measurement module 66 is designed to measure the first voltage U1 of the phase flowing through the first primary conductor 34, the second voltage U2 of the phase flowing through the second primary conductor 36, and the third voltage U3 of the phase flowing through the third primary conductor 38. The measurement module 66 is also designed to measure the frequency F of the three-phase voltage flowing through the primary conductors 34, 36, 38.

The information processing unit 68 comprises a processor 98 and a memory 100 suitable for storing a first software 102 for acquiring values of the voltages U1, U2, U3 measured by the measurement module 66 and a first software 103 for sampling, with a sampling period $P_{sample}$, the value of the measured voltage U1, U2, U3. The samples of the measured voltage U1, U2, U3 are respectively denoted $U1_{k,m}$, $U2_{k,m}$, $U3_{k,m}$ in which k is an index of a sampling window of predetermined duration, associated with the sampling, and m is a sampling index varying between 1 and $N_{sample}$, $N_{sample}$ being an integer number representing the number of voltage samples in the sampling window. $N_{sample}$ is for example equal to 36.

The sampling window is, for example, chosen to be equal to the voltage period $P_{voltage}$, that is to say equal to the inverse of the voltage frequency F measured by the measurement module 66. The sampling window is recomputed on each transmission period $P_{transmission}$ as a function of the value of the voltage frequency F measured by the measurement module 66 and acquired by the first acquisition software 102, during the penultimate transmission period $P_{transmission}$. The fact that the sampling window is calculated for the first device 60 with the value of the voltage frequency F measured during the penultimate transmission period makes it possible to use a same voltage frequency value F to compute the sampling window both for the first device 60 and for each of the second devices 62A, . . . , 62N.

The memory 100 is suitable for storing a first software 104 for determining a plurality of coefficients of a transform of the samples $U1_{k,m}$, $U2_{k,m}$, $U3_{k,m}$ of each voltage measured, up to a rank J of a value greater than or equal to 1, preferably greater than or equal to 5, more preferably equal to 15. By convention, the rank equal to 1 corresponds to the fundamental of the transform.

According to Shannon's theorem, the value of J must be less than or equal to $(N_{sample}/2)-1$. The value of J will preferably be chosen to be equal to $(N_{sample}/2)-3$. In the exemplary embodiment described, $N_{sample}$ is equal to 36, and the value of J is then equal to 15 with the above-mentioned formula.

The memory 100 is suitable for storing a first software 105 for transmitting a first main message M1 to each second device 62A, . . . , 62N and a first additional message M'1 to the centralizing device 64. The instants of transmission of two successive main messages M1, and of two successive additional messages M'1, are separated by a transmission period $P_{transmission}$. Each transmission period $P_{transmission}$ preferably has a predetermined value, for example equal to one second.

Each transmission period $P_{transmission}$ corresponds to a multiple of voltage periods $P_{voltage}$, the voltage period $P_{voltage}$ being equal to the inverse of the frequency F of the alternating voltage U1, U2, U3. The multiple is preferably an integer number of a value greater than or equal to 2, and the transmission period $P_{transmission}$ then corresponds to an integer multiple of voltage periods $P_{voltage}$.

As a variant, the multiple is a real number of a value strictly greater than 1. According to this variant, a smoothing of the value of the samples of the measured intensity will then be performed to take account of this non-integer value of the multiple.

The memory 100 is suitable for storing a first computation software 106 configured to compute at least one parameter for monitoring the voltage U1, U2, U3 as a function of at least one measured value of said voltage U1, U2, U3, preferably as a function of some of the measured values of said voltage U1, U2, U3 during a given transmission period $P_{transmission}$. Each monitoring parameter is chosen from an angular phase of the voltage U1, U2, U3 and a modulus of the voltage U1, U2, U3. The first computation software 106 is preferably configured to compute both the angular phase of the voltage U1, U2, U3 and the modulus of the voltage U1, U2, U3.

Hereinafter in the description, each voltage period is also referenced using the index k, given that the sampling window is preferably equal to the voltage period.

The memory 100 is suitable for storing a software 108 for distributing a single token to the second devices 62A, . . . , 62N successively.

When executed by the processor 98, the first acquisition software 102, the first sampling software 103, the first determination software 104, the first transmission software 105, the first computation software 106, and respectively the distributed token distribution software 108 form a first module for acquiring values of the measured voltages U1, U2, U3, a first module for sampling values of the measured voltages U1, U2, U3, a first module for determining transform coefficients of the samples, a first module for transmitting first messages M1, M'1, a first module for computing at least one voltage monitoring parameter, and respectively a distributed token distribution module.

As a variant, the first acquisition module 102, the first sampling module 103, the first determination module 104, the first transmission module 105, the first computation module 106, and the distributed token distribution module 108 are produced in the form of programmable logic components or even in the form of dedicated integrated circuits.

The transform is, for example, a Fourier transform, and the first determination software 104 is designed to compute the real $ReU_{i,j,k}$ and imaginary $ImU_{i,j,k}$ coefficients of the Fourier series decomposition of the samples $Ui_{k,m}$ of each measured voltage Ui, where i is an index of the corresponding phase, for example respectively equal to 1, 2 and 3, j is a rank of the Fourier series decomposition, with j between 1 and J, J being equal to the number of ranks of said decomposition, k is the index of the corresponding voltage period $P_{voltage}$, with k between 1 and K, K being equal to the number of voltage periods $P_{voltage}$ during a transmission period $P_{transmission}$. In the example of FIG. 8, K is denoted Ftr, the value K depending on the frequency F of the voltage. In the exemplary embodiment, the transmission period $P_{transmission}$ is equal to one second and the voltage period $P_{voltage}$ is substantially equal to 20 ms, such that K is substantially equal to 50.

As a variant, the transform is a Laplace transform.

The wireless transceiver 70 conforms to the ZigBee communication protocol based on the IEEE-802.15.4 standard. As a variant, the wireless transceiver 70 conforms to the IEEE-802.15.1 standard, or to the IEEE-802.15.2 standard, or even to the IEEE-802-11 standard, or even any other proprietary radio protocol.

The wireless antenna 72 is adapted to transmit wireless signals to antennas 82A, . . . , 82N of the second devices and the antenna 94 of the centralizing device, and also to receive wireless signals from said antennas 82A, . . . , 82N, 94. In other words, the first device 60 is linked to each of the second devices 62A, . . . , 62N and to the centralizing device 64 by a corresponding wireless link.

The power supply module 74 is designed to electrically power the measurement module 66, the information processing unit 68 and the wireless transceiver 70 from the three-phase voltage flowing through the primary conductors 34, 36, 38.

Each sensor of the intensity 76A of the second device 62A is designed to measure a respective intensity out of a first intensity I1A flowing in the first secondary outgoing conductor 42A, a second intensity I2A flowing in the second secondary outgoing conductor 44A and a third intensity I3A flowing in the third secondary outgoing conductor 46A.

Each sensor of the intensity 76A, also called current sensor, comprises a first toroid 110A arranged around the corresponding secondary outgoing conductor 42A, 44A, 46A and a first winding 112A arranged around the first toroid, as represented in FIG. 3. The circulation of the current through the corresponding secondary outgoing conductor is designed to generate an induced current proportional to the intensity of the current in the first winding 112A. The first toroid 110A is a Rogowski toroid. The first toroid 110A is preferably a split toroid in order to facilitate its arrangement around the corresponding conductors.

The information processing unit 78A, visible in FIG. 2, comprises a data processor 114A, and a memory 116A associated with the data processor. The memory 116A is designed to store a second software 118A for acquiring values of the respective intensities measured by each current sensor 76A, and a second software 119A for sampling, with a sampling period $P_{sample}$, the value of the first, second and third intensities I1A, I2A, I3A measured, and a software 120A for receiving the first main message M1.

The samples of the first, second and third intensities I1A, I2A, I3A measured are respectively denoted $I1A_{k,m}$, $I2A_{k,m}$, $I3A_{k,m}$ where k is the index of the sampling window of predetermined duration, associated with the sampling, and m is the sample index varying between 1 and $N_{sample}$, $N_{sample}$ being the integer number representing the number of voltage samples in the sampling window.

The sampling window is, for example, chosen to be equal to the voltage period $P_{voltage}$, that is to say equal to the inverse of the voltage frequency F, this value of the frequency being contained in each first main message M1 received. The sampling window is recomputed on each transmission period $P_{transmission}$ as a function of the value of the voltage frequency F contained in the first main message M1 received last, during the preceding transmission period $P_{transmission}$, that is to say the value of the voltage frequency F measured during the penultimate transmission period by the measurement module 60 of the first device.

The memory 116A is suitable for storing a second software 121A for determining a plurality of coefficients of a transform of the samples $I1A_{k,m}$, $I2A_{k,m}$, $I3A_{k,m}$ up to the rank J. The transform is, for example, a Fourier transform, and the second determination software 121A is designed to compute the real $ReI_{iA,j,k}$ and imaginary $ImI_{iA,j,k}$ coefficients of the Fourier series decomposition of the samples $IiA_{k,m}$ of each measured intensity IiA, where i is the index of the corresponding phase, j is the rank of the Fourier series decomposition, with j between 1 and J, k is the index of the corresponding voltage period $P_{voltage}$, with k between 1 and K.

As a variant, the transform is a Laplace transform.

The memory 116A is suitable for storing a software 122A for synchronizing the sampling of the intensities I1A, I2A, I3A measured relative to the sampling of the measured voltage U1, U2, U3. By convention, the voltage period of index k equal to 1 corresponds to the time period during which the first message M1 is transmitted by the first device 60 and respectively received by each second device 62A, . . . , 62N, and the voltage period of index k equal to 2 corresponds to the period at the start of which the synchronization of the voltage and intensity samplings is performed.

The memory 116A is suitable for storing a second computation software 124A configured to compute at least one parameter for monitoring the first, second and third intensities I1A, I2A, I3A as a function of at least one measured value of said intensities I1A, I2A, I3A, preferably as a function of some of the measured values of said intensities I1A, I2A, I3A during a given transmission period $P_{transmission}$. Each monitoring parameter is chosen from an angular phase of the first, second and third intensities I1A, I2A, I3A and a modulus of the first, second and third intensities I1A, I2A, I3A. The second computation software 124A is preferably configured to compute both the angular phase of said intensities I1A, I2A, I3A and the modulus of said intensities I1A, I2A, I3A.

The memory 116A is suitable for storing a second software 128A for transmitting a second message M2A to the centralizing device 64.

When executed by the processor 114A, the second acquisition software 118A, the second sampling software 119A, the reception software 120A, the second determination software 121A, the synchronization software 122A, the second computation software 124A, and respectively the second transmission software 128A form a second module for acquiring values of the measured intensities, a second module for sampling values of the measured intensities, a module for receiving the first main message M1, a second module for determining the transform coefficients of the samples, a module for synchronizing the sampling of the intensities I1A, I2A, I3A measured relative to sampling of the measured voltage U1, U2, U3, a second module for computing at least one parameter for monitoring the intensity, and respectively a second module for transmitting the second message M2A.

As a variant, the second acquisition module 118A, the second sampling module 119A, the reception module 120A, the second determination module 121A, the synchronization module 120A, the second computation module 124A and the second transmission module 128A are produced in the form of programmable logic components or even in the form of dedicated integrated circuits.

The wireless transceiver 80A is of the same type as the wireless transceiver 70.

The wireless antenna 82A, of the same type as the wireless antenna 72, is adapted to receive wireless signals from the antenna 72 of the first device and from the antenna 94 of the centralizing device and also to transmit wireless signals to the antennas 72, 94.

The power supply module 84A, visible in FIG. 3, is designed to power the information processing unit 78A and the wireless transceiver 80A. The power supply module 84A comprises, for each of the first 42A, second 44A and third 46A secondary conductors, a second toroid 130A arranged around the corresponding secondary conductor 42A, 44A, 46A and a second winding 132A arranged around the second toroid. The flowing of the current in the corresponding secondary conductor 42A, 44A, 46A is designed to generate an induced current in the second winding 132A.

The power supply module 84A comprises a converter 134A connected to each of the second windings 132A and designed to deliver a predetermined voltage to the information processing unit 78A and to the wireless transceiver 80A. Each second toroid 130A is an iron toroid. Each second toroid 130A is preferably a split toroid in order to facilitate its arrangement around the corresponding conductors.

In other words, the second device 62A is self-powered via the power supply module 84A comprising the second toroids 130A adapted to harvest the magnetic energy from the flowing of the current in the corresponding secondary conductors 42A, 44A, 46A.

The elements of the other second devices 62B, ..., 62N are identical to the elements of the first second device 62A described previously, and comprise the same sub-elements, each time replacing the letter A with the corresponding letter B, ..., N concerning the references of the sub-elements.

The information processing unit 86 of the centralizing device, visible in FIG. 2, comprises a data processor 136, and a memory 138 associated with the processor. The memory 138 is suitable for storing a software 140 for receiving the first additional message M'1 and second messages M2A, ..., M2N, a software 142 for storing in the database 88 information contained in the messages M'1, M2A, ..., M2N received. The memory 138 is designed to store a software 144 for processing said received information, a software 146 for displaying data and a software 148 for transmitting data to a remote server, not represented. The processing software 144 is notably configured to compute the electrical energy $E_i$ of the alternating current flowing in each secondary electrical conductor 42A, ..., 46N from the monitoring parameters computed by the first monitoring device 60 and by each second monitoring device 62A, ..., 62N, these computed monitoring parameters being contained in the data messages M'1, M2A, M2N received.

When executed by the processor 136, the reception software 140, the storage software 142, the processing software 144, the display software 146, and respectively the transmission software 148 form a module for receiving the first additional message M'1 and second messages M2A, ..., M2N, a module for storing in the database 88 information contained in the messages M'1, M2A, ..., M2N received, a module for processing said received information, a module for displaying data and a module for transmitting data to a remote server.

As a variant, the reception module 140, the storage module 142, the processing module 144, the display module 146, and the transmission module 148 are produced in the form of programmable logic components or even in the form of dedicated integrated circuits.

The human-machine interface 90 comprises a display screen and an input keyboard, not represented.

The wireless transceiver 92 is of the same type as the wireless transceivers 70, 80A, ..., 80N.

The wireless antenna 94, of the same type as the wireless antennas 72, 82A, ..., 82N, is designed to receive wireless signals from the antenna 72 of the first device and from the antennas 82A, ..., 82N of the second devices and also to transmit wireless signals to said antennas 72, 82A, ..., 82N.

The operation of the monitoring system 20 will now be explained with the help of FIGS. 4, 5 and 6 representing flow diagrams of the steps of a monitoring method implemented respectively by the first device 60, by the second devices 62A, ..., 62N and by the centralizing device 64.

As represented in FIG. 4, in a first step 200, the first device 60 is initialized, then measures, in the next step 205, the frequency F of the three-phase voltage flowing through the primary conductors 34, 36, 38 via the measurement module 60 and the first acquisition software 102. The frequency F of the three-phase voltage is, for example, substantially equal to 50 Hz.

In order to optimize the accuracy of the energy measurement, the period $P_{voltage}$ of the voltage is measured regularly, preferably on each transmission period $P_{transmission}$, in order to take account of the variations in time thereof.

In the next step 208, the sampling window is computed by the first sampling software 103 as a function of the value of the frequency F of the three-phase voltage. In other words, the sampling period $P_{sample}$ is computed from the value of the frequency F, knowing that the product of the sampling period $P_{sample}$ and of the frequency F is equal to a predetermined constant.

More specifically, the sampling period $P_{sample}$ bears out the following equation:

$$P_{sample} \times F = \frac{1}{N_{sample}} \quad (1)$$

$$\text{or even: } P_{sample} = \frac{P_{voltage}}{N_{sample}} \quad (2)$$

In the exemplary embodiment described, $N_{sample}$ is equal to 36, and the sampling window then comprises 36 voltage samples for each period $P_{voltage}$ of the voltage. The period $P_{voltage}$ of the three-phase voltage is equal to the period of the network, i.e. approximately 20 ms in Europe and approximately 16.66 ms in the US. The voltage period $P_{voltage}$ corresponds to a multiple of the sampling period $P_{sample}$, in accordance with the above equation (2).

The first device 60 then measures, in the step 210, the first, second and third voltages U1, U2, U3 using its measurement module 66 and its first acquisition software 102. The first sampling software 103 then samples the measured values of the voltages U1, U2, U3 according to the sampling period $P_{sample}$, computed in the step 208.

In the step 220, the first device 60 compresses the measured values of the voltages U1, U2, U3 by determining real $ReU_{i,j,k}$, and imaginary $ImU_{i,j,k}$ coefficients of the Fourier series decomposition of the samples $Ui_{k,m}$ of each measured voltage U1, U2, U3 using its first determination software 104. This makes it possible to limit the quantity of data transmitted via wireless links between the first device 60 and the centralizing device 64.

The coefficients $ReU_{i,j,k}$, $ImU_{i,j,k}$ of the Fourier series decomposition are, for example, obtained by correlation operations on the samples of the measured values. More specifically, the real coefficient of the fundamental, denoted $ReU_{i,1,k}$, is a correlation, over a duration equal to the period $P_{voltage}$ of the three-phase voltage, between the samples $Ui_{k,m}$ of the voltage signal Ui and a cosine of frequency equal to the frequency F of the three-phase voltage, where Ui represents the voltage of the phase, i being equal to 1, 2 or 3. The imaginary coefficient of the fundamental, denoted $ImU_{i,1,k}$, is a correlation, over a duration equal to the period $P_{voltage}$, between the samples $Ui_{k,m}$ of the voltage signal Ui and a sine of frequency equal to the frequency F.

The real coefficient of the harmonic of rank j, denoted $ReU_{i,j,k}$, j being between 2 and J, is the correlation, over a duration equal to the period $P_{voltage}$, between the samples $Ui_{k,m}$ of the voltage signal Ui and a cosine of frequency equal to j times the frequency F. The imaginary coefficient of the harmonic of rank j, denoted $ImU_{i,j,k}$, is the correlation, over a duration equal to the period $P_{voltage}$, between the samples $Ui_{k,m}$ of the voltage signal Ui and a sine of frequency equal to j times the frequency F.

In other words, the coefficients $ReU_{i,j,k}$ and $ImU_{i,j,k}$ bear out the following equations, j being between 1 and J:

$$ReU_{i,j,k} = \sum_{m=1}^{N_{sample}} Ui_{k,m} \times \cos(2 \times \Pi \times F_{voltage} \times j \times m \times T) \quad (3)$$

$$ImU_{i,j,k} = \sum_{m=1}^{N_{sample}} Ui_{k,m} \times \sin(2 \times \Pi \times F_{voltage} \times j \times m \times T) \quad (4)$$

where T represents the sampling period, also denoted $P_{sample}$.

As a variant, the coefficients $ReU_{i,j,k}$ and $ImU_{i,j,k}$ are obtained by a fast Fourier transform, also called FFT.

The first determination software 104 then computes the complex coefficients $ReU_{i,j,k}$ and $ImU_{i,j,k}$ of the Fourier series decompositions of the three voltages U1, U2, U3 for the fundamental and the harmonics 2 to J.

The first computation software 106 then computes the monitoring parameters, for example the angular phase of the voltage, using the following equation:

$$\varphi_{i,j,k}(U) = \arctan\left(\frac{ImU_{i,j,k}}{ReU_{i,j,k}}\right) \quad (5)$$

where $\varphi_{i,j,k}(U)$ is the angular phase of the voltage for the phase of index i, the harmonic of rank j, the voltage period $P_{voltage}$ of index k, $ReU_{i,j,k}$, $ImU_{i,j,k}$ represent real and imaginary coefficients of a Fourier series decomposition of the voltage for the phase of index i, the harmonic of rank j, and the voltage period $P_{voltage}$ of index k.

The angular phase $\varphi_{i,j,k}(U)$ of the voltage is preferably computed only for the first voltage period $P_{voltage}$ of index 1.

The angular phase $\varphi_{i,j,k}(U)$ of the voltage is preferably computed only for the harmonics of rank j respectively equal to 1, 3 and 5.

In addition, the first computation software 106 computes the modulus of the voltage using the following equation:

$$\|U_{i,j,k}\| = \sqrt{\frac{(ReU_{i,j,k})^2 + (ImU_{i,j,k})^2}{2}} \quad (6)$$

where $\|U_{i,j,k}\|$ is the modulus, in the mathematical sense, of the voltage for the phase of index i, the harmonic of rank j, the voltage period $P_{voltage}$ of index k, $ReU_{i,j,k}$, $ImU_{i,j,k}$ represent real and imaginary coefficients of a Fourier series decomposition of the voltage for the phase of index i, the harmonic of rank j, and the voltage period $P_{voltage}$ of index k.

The modulus $\|U_{i,j,k}\|$ of the voltage is preferably computed for each of the voltage periods $P_{voltage}$ of index k between 1 and $K_{max,U}$, $K_{max,U}$ being, for example, equal to K−1.

The modulus $\|U_{i,j,k}\|$ of the voltage is preferably computed for the harmonics of rank j respectively equal to each of the odd values between 1 and J.

Finally, in the step 230, the first device 60 transmits, using its transmission software 105, the first main message M1 to each of the second devices 62A, . . . 62N and the first additional message M'1 to the centralizing device 64.

The first device 60 also launches, in this step 230, a first timer equal to a reference duration Df, to be counted from the instant of the start of transmission of the first message M1, also called transmission cue Te of the first message M1. When this first timer times out, the first device 60 then starts sampling the measured values of the three voltages U1, U2, U3, that is to say at a sampling start instant Tm equal to the transmission start instant Te plus the reference duration Df. The sampling, by the second device 62A, of the measured values of the three intensities I1A, I2A, I3A will also begin at this sampling start instant Tm, as will be described in more detail hereinbelow with respect to the synchronization step 320.

The reference duration Df has a predetermined value, for example substantially equal to 6 ms. The value of the reference duration Df is known to both the first device 60 and the second device 62A, and is chosen to be greater than the duration necessary for the transmission and the reception of the first message M1. In the exemplary embodiment described, the value of the reference duration Df is stored, prior to the initial step 200, in the memory 100 of the first device and in the memory 116A of the second device 62A.

The first main message M1 and the first additional message M'1 each comprise a header field, also called preamble, an SFD (Start of Frame Delimiter) field, a PHR (Physical Header) field, a data field and a CRC (Cyclic Redundancy Check) field. The preamble has a size of 4 bytes, the SFD and PHR fields each have a size of 1 byte, the data field is of variable size, denoted n bytes, and the CRC field has a size of 2 bytes. In the exemplary embodiment of FIG. 7, the first message M1 is made up of the header field, the SFD field, the PHR field, the data field and the CRC field.

The data field of the first main message M1 contains the value of the frequency F measured in the step 205, the identifier of the second device which will be authorized to transmit its second message to the centralizing device 64 after the reception of the first message M1, and the value of the reference duration Df in case of modification thereof. The identifier of the second device authorized to transmit its measurement information is determined using the single token distribution software 108, the identifier of the device contained in the first main message M1 making it possible to designate the second device to which the single token has been assigned.

The data field of the first additional message M'1 notably contains the monitoring parameters $\varphi_{i,j,k}(U)$, $\|U_{i,j,k}\|$ determined previously in the step 220.

After the transmission of the first messages M1, M'1, the first device 60 returns to the step 205 in order to again measure the frequency F, then the voltage U1, U2, U3 of the phases of the three-phase voltage flowing in the primary conductors 34, 36, 38.

The steps, visible in FIG. 5, of the computation method implemented by the second devices 62A, . . . , 62N will now be described for the second device with the reference 62A.

In the step 300, the second device 62A is initialized and opens a sliding window for reception of the first message M1 using its reception software 120A. The reception window is a window having a duration of a few tens of milliseconds that the second device 62A slides in time.

On the reception of the first message M1 during the step 310, the second device 62A detects the instant Tr of reception of the SFD field, the reception of the SFD field leading to the triggering of an interruption by the wireless receiver of the second device 62A, as represented in FIG. 7.

In the next step 315, the sampling window is computed by the second sampling software 119A as a function of the value of the frequency F contained in the first message M1 received. This step is similar to the step 208 described previously, the sampling period $P_{sample}$ bearing out the abovementioned equations (1) and (2).

The voltage period $P_{voltage}$ is thus recomputed, by the second sampling software 119A, on each reception of a first message M1 using the value of the voltage frequency F contained in the first message M1.

The sampling window is then computed as a function of the value of the voltage frequency F measured in the penultimate transmission period $P_{transmission}$ by the measurement module 60 of the first device. In order to use a same sampling window for the sampling of the intensity, on the one hand, and of the voltage, on the other hand, the value of the frequency F, taken into account by the first device 60 in the step 208, is preferably the penultimate value measured by the measurement module 60.

The second device 62A then goes on to the step 320 of time synchronization with the first device 60. The detection of the reception instant Tr makes it possible to compute, using the synchronization software 122A, the instant Tm of the start of the sampling of the measured values of the three intensities I1A, I2A, I3A. The sampling start instant Tm is in effect equal to the reception instant Tr plus a synchronization duration Dm, the synchronization duration Dm being equal to the reference duration Df minus a radio transmission duration Dr, as represented in FIG. 7. The radio transmission duration Dr is a value dependent on the wireless transceiver 70 and the wireless transceiver 80A. The radio transmission duration Dr corresponds to the time period between the transmission start instant Te and the reception instant Tr.

The radio transmission duration Dr is for example substantially equal to 0.6 ms, and is known to the second device 62A. In the exemplary embodiment described, the value of the radio transmission duration Dr is stored, prior to the step 300, in the memory 116A of the second device 62A.

The second device 62A then launches, from the reception instant Tr and using the synchronization software 122A, a second timer equal to the synchronization duration Dm, the value of the synchronization duration Dm being computed by subtraction of the value of the radio transmission duration Dr from the value of the reference duration Df, the value of the radio transmission duration Dr and the value of the reference duration Df being stored in the memory 116A as described previously.

The first device 60 had also launched, in the step 230, the first timer equal to the reference duration Df, such that the first device 60 and the second device 62A will simultaneously begin sampling the measured voltage values, and respectively the measured intensity values, when the first and second timers launched in the steps 230 and 320 are timed out, that is to say at the sampling start instant Tm.

By convention, the voltage period corresponding to the transmission of the first message M1 is the period of index k equal to 1. When the first message M1 has also been received during the voltage period of index k equal to 1, the sampling start instant following the synchronization then corresponds to the start of the voltage period of index k equal to 2.

In the step 320, the synchronization software 122A initializes, at the time of reception of the first message M1, a counter intended to be incremented up to a value corresponding to the period of transmission of the first message $P_{transmission}$. The second device 62A then returns automatically to the reception step 310 approximately one millisecond before the expected reception of the next first message M1.

If the first message M1 is not detected by the second device 62A, the reception window is closed again and no synchronization is performed. The counter is then incremented for a new synchronization attempt on the next probable message M1.

The second device 62A then measures, in the step 330 and via its current sensors 76A and its second acquisition software 118A, each of the first, second and third intensities I1A, I2A, I3A.

The second sampling software 119A then samples the measured values of the three intensities I1A, I2A, I3A, the sampling start instant Tm having been computed in the preceding step 320 in order to ensure the time synchronization of the intensity sensor 76A relative to the voltage measurement member 66.

The second determination software 121A then compresses the measured values of the intensities I1A, I2A, I3A in the step 340. The second determination software 121A computes, for example, the real $\mathrm{Re}I_{iA,j,k}$ and imaginary $\mathrm{Im}I_{iA,j,k}$ coefficients of the Fourier series decomposition of the samples $IiA_{k,m}$ of each measured intensity I1A, I2A, I3A of the three phases in a manner similar to the computation, described for the step 220, of the complex coefficients $\mathrm{Re}U_{i,j,k}$, $\mathrm{IMU}_{i,j,k}$ of the Fourier series decomposition of the voltages.

The real coefficient of the fundamental, also denoted $\mathrm{Re}I_{iA,1,k}$, is thus a correlation, over a duration equal to the period $P_{voltage}$ of the three-phase voltage, between the samples of the signal of the intensity IiA and a cosine of frequency equal to the frequency F of the three-phase voltage, where IiA represents the intensity of the phase number i, i being equal to 1, 2 or 3. The imaginary coefficient of the fundamental, also denoted $\mathrm{Im}I_{iA,1,k}$, is a correlation, over a duration equal to the period $P_{voltage}$, between the samples of the signal of the intensity IiA and a sine of frequency equal to the frequency F.

The real coefficient of the harmonic of rank j, denoted $\mathrm{Re}I_{iA,j,k}$, j being between 2 and J, is the correlation, over a duration equal to the period $P_{voltage}$, between the samples of the signal of the intensity IiA and a cosine of frequency equal to j times the frequency F. The imaginary coefficient of the harmonic of rank j, denoted $\mathrm{Im}I_{iA,j,k}$, j being between 2 and J, is the correlation, over a duration equal to the period $P_{voltage}$, between the samples of the signal of the intensity IiA and a sine of frequency equal to j times the frequency F.

The coefficients $\mathrm{Re}I_{iA,j,k}$ and $\mathrm{Im}I_{iA,j,k}$ then bear out the following equations:

$$\mathrm{Re}I_{iA,j,k} = \sum_{m=1}^{N_{sample}} IiA_{k,m} \times \cos(2 \times \Pi \times F_{voltage} \times j \times m \times T) \quad (8)$$

$$\mathrm{Im}I_{iA,j,k} = \sum_{m=1}^{N_{sample}} IiA_{k,m} \times \sin(2 \times \Pi \times F_{voltage} \times j \times m \times T) \quad (9)$$

The second computation software 124A then computes, during this step 340, the monitoring parameters, for example the angular phase of the intensity, using the following equation:

$$\varphi_{i,j,k}(I_A) = \arctan\left(\frac{\mathrm{Im}I_{iA,j,k}}{\mathrm{Re}I_{iA,j,k}}\right) \quad (10)$$

in which $\varphi_{i,j,k}(I_A)$ is the angular phase of the intensity $I_A$ for the phase of index i, the harmonic of rank j, the voltage period $P_{voltage}$ of index k, $ReI_{iA,j,k}$, $ImI_{iA,j,k}$ represent the real and imaginary coefficients of a Fourier series decomposition of the intensity $I_A$ for the phase of index i, the harmonic of rank j, and the voltage period $P_{voltage}$ of index k; that is to say of the intensity IiA for the harmonic of rank j, and the voltage period $P_{voltage}$ of index k.

The angular phase $\varphi_{i,j,k}(I_A)$ of the intensity $I_A$ is preferably computed only for the first voltage period $P_{voltage}$ of index 1.

The angular phase $\varphi_{i,j,k}(I_A)$ of the intensity $I_A$ is preferably computed only for the harmonics of rank j respectively equal to 1, 3 and 5.

In addition, the second computation software 124A computes the modulus of the intensity using the following equation:

$$\|I_{iA,j,k}\| = \sqrt{\frac{(ReI_{iA,j,k})^2 + (ImI_{iA,j,k})^2}{2}} \quad (11)$$

in which $\|I_{iA,j,k}\|$ is the modulus, in the mathematical sense, of the intensity $I_A$ for the phase of index i, the harmonic of rank j, the voltage period $P_{voltage}$ of index k, $ReU_{i,j,k}$, $ImU_{i,j,k}$ represent real and imaginary coefficients of a Fourier series decomposition of the intensity $I_A$ for the phase of index i, the harmonic of rank j, and the voltage period $P_{voltage}$ of index k.

The modulus $\|U_{i,j,k}\|$ of the voltage is preferably computed for the voltage periods $P_{voltage}$ of index k between 1 and $K_{max,T}$, $K_{max,I}$ being for example equal to 10.

The modulus $\|U_{i,j,k}\|$ of the voltage is preferably computed for the harmonics of rank j respectively equal to each of the odd values between 1 and J.

In addition, optionally, the second computation software 124A computes an average value $Irms_{i,k}$ of the intensity over all of the harmonics taken into account, that is to say the harmonics of rank j between 1 and J, for the phase of index i and the voltage period $P_{voltage}$ of index k, using the following equation:

$$Irms_{i,k} = \sqrt{\sum_{j=1}^{J} \|I_{iA,j,k}\|^2} \quad (12)$$

The second device 62A then generates, in the step 350, its second message M2A. The second message M2A contains the identifier of the second device 62A, all of the intensity monitoring parameters $\varphi_{i,j,k}(I_A)$, $\|I_{iA,j,k}\|$ determined previously in the step 340, and the average values of the intensity $Irms_{i,k}$ if appropriate.

If it is assumed that the identifier of the second device 62A was contained in the first message M1 received previously, the second device 62A then transmits, in the step 360, its second message M2A using its transmission software 128A. Otherwise, the second device 62A returns directly to the step 310 of reception of the first message M1, and transmits its second message M2A when the first message M1 contains its identifier then indicating that the single token has been assigned to it in order to authorize it to transmit its second message M2A.

After the transmission step 360 in the case where the token had been assigned to the second device 62A, or else after the step 340 otherwise, the second device 62A returns to the reception step 310 if the counter has reached the value corresponding to the transmission period $P_{transmission}$, or else to the measurement step 330 otherwise.

The steps of the computation method implemented by the other second devices 62B, ..., 62N are identical to the steps 300 to 360 described previously for the second device with the reference 62A, and are also performed simultaneously between all the second devices 62A, ..., 62N through the time synchronization performed using the first message M1.

In the transmission step 360, the only second device out of all of the second devices 62A, ..., 62N authorized to transmit its second message is the second device whose identifier is contained in the first message M1 received in the preceding reception step 310. The distribution software 108 determines, in an ascending order, the identifiers contained in the first message M1 in order to successively assign the single token to the second devices 62A, ..., 62N. In other words, each second device 62A, ..., 62N transmits, every N seconds, its respective second message M2A, M2N.

As represented in FIG. 6, in the step 400, the centralizing device 64 receives, using its reception software 140, the first additional message M'1 from the first device 60 and the second message from the second device authorized to transmit according to the distributed token mechanism, for example the message M2A.

In the step 410, the centralizing device 64 then stores, in its database 88, the values received and contained in the first additional message M'1 and in the second message M2A, via its storage software 142. In addition, the processing software 144 performs a time-stamping of the stored data.

The processing software 144 then computes the active energy $E_{active1}$, $E_{active2}$, $E_{active3}$ for each of the three phases from all of the computed monitoring parameters, previously received from the first device 60 via the first additional message M'1 and the second message M2A. The period of computation of the active energies $E_{active,1}$, $E_{active,2}$, $E_{active,3}$ is equal to the period of transmission of the first message $P_{transmission}$, i.e. for example 1 s. In addition, the processing software 144 then computes the reactive energy $E_{reactive,1}$, $E_{reactive,2}$, $E_{reactive,3}$, and even the apparent energy $E_{apparent,1}$, $E_{apparent,2}$, $E_{apparent,3}$ for each of the three phases also from all of the computed monitoring parameters.

The processing software 144 then forms a software for computing the electrical energy for each of the three phases from all of the computed monitoring parameters.

For the computation of these energies, the processing software 144 begins by computing the phase difference between current and voltage using the computed angular phases, according to the following equation:

$$\varphi_{i,j,k} = \varphi_{i,j,k}(I_A) - \varphi_{i,j,k}(U) \quad (13)$$

in which $\varphi_{i,j,k}$ is the phase difference between current and voltage for the phase of index i, the harmonic of rank j, the voltage period $P_{voltage}$ of index k.

According to the above, the phase difference between current and voltage $\varphi_{i,j,k}$ is preferably computed only for the first voltage period $P_{voltage}$ of index 1.

The phase difference between current and voltage $\varphi_{i,j,k}$ is preferably computed only for the harmonics of rank j respectively equal to 1, 3 and 5.

Assuming that the average value $Irms_{i,k}$ of the intensity has not been computed previously in the step 340, the processing software 144 computes it in this step 420 using the abovementioned equation (12).

The processing software 144 then computes an average value $Im_{iA,j}$ of the intensity over all of the voltage periods $P_{voltage}$ taken into account, that is to say the voltage periods $P_{voltage}$ of index k between 1 and $K_{max,I}$, for the phase of index i and the harmonic of rank j, using the following equation:

$$Im_{iA,j} = \frac{\sum_{k=1}^{K_{max,I}} \|I_{iA,j,k}\|}{K_{max,I}} \quad (14)$$

The processing software 144 then computes an average value $Um_{i,j}$ of the voltage over all of the voltage periods $P_{voltage}$ taken into account, that is to say the voltage periods $P_{voltage}$ of index k between 1 and $K_{max,U}$, for the phase of index i and the harmonic of rank j, using the following equation:

$$Um_{i,j} = \frac{\sum_{k=1}^{K_{max,U}} \|U_{i,j,k}\|}{K_{max,U}} \quad (15)$$

The processing software 144 then computes the active power $P_{i,j}$ for each phase number i, i being equal to 1, 2 or 3, and for each harmonic of rank j respectively equal to 1, 3 and 5, using the following equation:

$$P_{i,j} = Um_{i,j} \times Im_{iA,j} \times \cos(\varphi_{i,j,1}) \quad (16)$$

The processing software 144 also computes the reactive power $Q_{i,j}$ for each phase number i, i being equal to 1, 2 or 3, and for each harmonic of rank j respectively equal to 1, 3 and 5, using the following equation:

$$Q_{i,j} = Um_{i,j} \times Im_{iA,j} \times \sin(\varphi_{i,j,1}) \quad (17)$$

The processing software 144 further computes the apparent power $S_{i,j}$ for each phase number i, i being equal to 1, 2 or 3, and for each harmonic of rank j respectively equal to 1, 3 and 5, using the following equation:

$$S_{i,j} = Um_{i,j} \times Im_{iA,j} \quad (18)$$

The active $E_{active,i}$, reactive $E_{reactive,i}$ and apparent $E_{apparent,i}$ energies of each phase of index i are finally computed using the following equations:

$$E_{active,i} = (P_{i,1} + P_{i,3} + P_{i,5}) \times P_{transmission} \quad (19)$$

$$E_{reactive,i} = (Q_{i,1} + Q_{i,3} + Q_{i,5}) \times P_{transmission} \quad (20)$$

$$E_{apparent,i} = (S_{i,1} + S_{i,3} + S_{i,5}) \times P_{transmission} \quad (21)$$

The computation of the active $E_{active,i}$, reactive $E_{reactive,i}$ and apparent $E_{apparent,i}$ energies is performed at any moment during a transmission period $P_{transmission}$ between two message M1 receptions, the information necessary for the computation being contained in the first additional message M'1 and the second message M2A received previously, given that the values relating to the voltage and intensities taken into account correspond to the preceding transmission period $P_{transmission}$. In the example of FIG. 8, the computation of the active $E_{active,i}$, reactive $E_{reactive,i}$ and apparent $E_{apparent,i}$ energies is performed substantially in the middle of the transmission period.

The quantities measured and computed by the monitoring system 20, notably the active $E_{active,i}$, reactive $E_{reactive,i}$ and apparent $E_{apparent,i}$ energies of each phase of index i between 1 and 3, are then displayed on the screen of the human-machine interface 90 of the centralizing device via the display software 146 in the step 430. These quantities are displayed in the form of numeric values and/or in the form of curves.

The centralizing device 64 finally transmits, in the step 440 and using its transmission software 148, these measured and computed quantities to the remote server, not represented. The remote server is designed to perform a centralized management of the measured and computed quantities for each computation system 20.

At the end of the step 440, the centralizing device 64 returns to the step 400, in order to receive the next first additional message M'1 from the first device and the second message from the second device authorized to transmit, the next time according to the distributed token mechanism, for example the message M2A.

The monitoring system 20 according to the invention thus makes it possible to compute the active $E_{active,i}$, reactive $E_{reactive,i}$ and apparent $E_{apparent,i}$ energies directly over the given transmission period $P_{transmission}$ and as a function of all of the monitoring parameters $\varphi_{i,j,k}(U)$, $\|U_{i,j,k}\|$, respectively $\varphi_{i,j,k}(I_A)$, $\|I_{iA,j,k}\|$ computed by the first device 60 and respectively the second device 62A. The monitoring system 20 further makes it possible to reduce the quantity of data transmitted via the messages M1, M'1, M2A, M2N, and also reduce the computations performed by the second monitoring device 62A which is self-powered. In effect, the second monitoring device 62A computes only the intensity monitoring parameters $\varphi_{i,j,k}(I_A)$, $\|I_{iA,j,k}\|$, and the computation of the active $E_{active,i}$, reactive $E_{reactive,i}$ and apparent $E_{apparent,i}$ energies is then performed by the centralizing device 64.

The monitoring system 20 according to the invention is thus less bandwidth-intensive for the wireless links between the different devices 60, 62A, . . . , 62N, 64, while also being less energy-intensive for the devices which are self-powered, namely the second monitoring devices 62A, . . . , 62N.

The monitoring system 20 according to the invention further makes it possible to obtain a very accurate measurement of the active $E_{active,i}$, reactive $E_{reactive,i}$ and apparent $E_{apparent,i}$ energies for the three phases of the three-phase current, through the time synchronization of each current sensor 76A relative to the voltage measurement module 66.

The time synchronization is very accurate, the measured synchronization offset being of the order of plus or minus 400 nanoseconds with the current technology of the wireless transceivers 70, 80A, . . . , 80N, 92 and the information processing units 68, 78A, . . . , 78N, 86.

All of the devices 60, 62A, . . . , 62N, 64 are linked together by wireless links via their respective wireless transceiver 70, 82A, . . . , 82N, 92, which makes it possible to facilitate the installation of the monitoring system 20 in the transformer substation 10.

The compression of the data relating to the voltages and the intensities measured using the determination softwares 104, 124A, . . . , 124N and the reduced transmission of data between the different devices 60, 62A, . . . , 62N, 64 further makes it possible to reduce the sensitivity of the monitoring system 20 to scrambling-type radiofrequency disturbances or electromagnetic compatibility disturbance, also called EMC disturbance.

According to a second embodiment, visible in FIG. 9, the first device 60 and the centralizing device 64 are combined in one and the same common device 160, which makes it possible notably to have a single wireless transceiver 70 for said common device 160 instead of the two wireless transceivers 70, 92 of the first device and of the centralizing device.

According to this second embodiment, the common device 160 comprises the module 66 for measuring the voltage of the current flowing in the corresponding primary conductor 34, 36, 38, and the information processing unit 68. The first device 60 comprises the wireless transceiver 70, the wireless antenna 72, and the electrical power supply module 74 for the measurement module, the information processing unit and the wireless transceiver.

According to this second embodiment, the memory 100 of the first device is then suitable for storing the first acquisition software 102, the first sampling software 103, the first determination software 104, the first transmission software 105, the first computation software 106, the distributed token distribution software 108. The memory 100 is also suitable for storing the reception software 140, the storage software 142, the processing software 144, the display software 146, and the transmission software 148.

A person skilled in the art will obviously understand that, according to this second embodiment, the first transmission software 105 is configured to send only the first main message M1 to each second device 62A, ..., 62N, no first additional message being transmitted according to this second embodiment. Similarly, the reception software 140 is configured to receive only the second messages M2A, ..., M2N.

A person skilled in the art will also note that, as a variant of this second embodiment, the first computation software 106 and the processing software 144 form a single computation software configured to compute both the voltage monitoring parameters, then the values of the energies as a function of the voltage monitoring parameters computed previously and of the intensity monitoring parameters contained in the corresponding second message M2A, ..., M2N received.

The operation of this second embodiment is similar to that of the first embodiment described previously with respect to the flow diagrams of FIGS. 4 to 6, and is not described again. The flow diagrams of FIGS. 4 and 6 are implemented by the common device 160.

The advantages of this second embodiment include those of the first embodiment described previously. The monitoring system according to this second embodiment further makes it possible to offer a system that is simpler and less costly and with a lower specific electrical energy consumption.

The invention claimed is:

1. An electronic system for monitoring an electrical switchboard comprising:
at least one primary outgoing electrical conductor and at least one secondary outgoing electrical conductor, each secondary outgoing conductor being electrically connected to a corresponding primary outgoing conductor, the corresponding outgoing conductors exhibiting an alternating voltage; and
a first electronic device for monitoring the voltage of each primary outgoing electrical conductor,
at least one second electronic device for monitoring only the intensity of the alternating current flowing in each secondary electrical conductor, the at least one second electronic device being self-powered,
wherein one of the first electronic device and the at least one second electronic device is an electronic device for monitoring an electrical quantity and includes circuitry configured to implement
a measurement module configured to measure at least one value of the electrical quantity,
a wireless transceiver,
a transmission module linked to the wireless transceiver,
wherein:
the measurement module is configured to compute a plurality of monitoring parameters ($\varphi_{i,j,k}(X)$, $\|X_{i,j,k}\|$) for monitoring the electrical quantity as a function of at least one measured value of said electrical quantity, the monitoring parameters ($\varphi_{i,j,k}(X)$, $\|X_{i,j,k}\|$) including an angular phase of the electrical quantity ($\varphi_{i,j,k}(X)$) and a modulus of the electrical quantity ($\|X_{i,j,k}\|$),
the transmission module being configured to wirelessly transmit, to the other electronic device which is self-powered, a data message containing the at least one computed monitoring parameter ($\varphi_{i,j,k}(X)$, $\|X_{i,j,k}\|$),
wherein the measurement module is configured to compute the angular phase ($\varphi_{i,j,k}(X)$) of the electrical quantity, for each phase of index i, according to the equation:

$$\varphi_{i,j,k}(X) = \arctan\left(\frac{\mathrm{Im}X_{i,j,k}}{\mathrm{Re}X_{i,j,k}}\right)$$

in which $\mathrm{Re}X_{i,j,k}$, $\mathrm{Im}X_{i,j,k}$ represent real and imaginary coefficients of a Fourier series decomposition of the electrical quantity,
i is the index of the corresponding phase,
j is the rank of the harmonic for the Fourier series decomposition, the fundamental being of rank equal to 1, and
k is an index of a voltage period $P_{voltage}$ during which the value of the electrical quantity is measured, and
wherein the computation module is configured to compute the modulus ($\|X_{i,j,k}\|$) of the electrical quantity, for each phase of index i, according to the equation:

$$\|X_{i,j,k}\| = \sqrt{\frac{(\mathrm{Re}X_{i,j,k})^2 + (\mathrm{Im}X_{i,j,k})^2}{2}}$$

in which $\mathrm{Re}X_{i,j,k}$, $\mathrm{Im}X_{i,j,k}$ represent real and imaginary coefficients of a Fourier series decomposition of the electrical quantity,
i is the index of the corresponding phase,
j is the rank of the harmonic for the Fourier series decomposition, the fundamental being of rank equal to 1, and
k is an index of a voltage period $P_{voltage}$ during which the value of the electrical quantity is measured.

2. A system according to claim 1, wherein when the first electronic device is the electronic device for monitoring an electrical quantity, the measurement module of the first electronic device is configured to also measure the frequency of the voltage, and the message transmitted by the transmission module of the first monitoring device further contains a measured value of the frequency.

3. A system according to claim 2, in which each second electronic device further comprises a module for sampling the value of the measured intensity according to a sampling period and a reception module for receiving the message transmitted by the transmission module of the first electronic device, the reception module being linked to the wireless transceiver, and in which the value of the sampling period is a function of the measured value of the frequency of the voltage, contained in the last message received from the transmission module of the first electronic device.

4. A system according to claim 1, in which the system further comprises a centralizing electronic device configured to receive the data messages transmitted by the first electronic device and by each second electronic device, the centralizing electronic device being further configured to compute the electrical energy of the alternating current flowing in each secondary electrical conductor from the monitoring parameters computed by the first electronic device and by each second electronic device, these computed monitoring parameters being contained in the data messages received.

5. A system according to claim 1, in which the first electronic device further comprises a reception module for receiving the message transmitted by the transmission module of each second electronic device, the computation module of the first electronic device being further configured to compute the electrical energy of the alternating current flowing in each secondary electrical conductor from the monitoring parameters computed by it and by each second electronic device, the monitoring parameters computed by each second electronic device being contained in the data messages received by said reception module.

6. An electrical enclosure, comprising:

an electrical switchboard comprising at least one primary outgoing electrical conductor and at least one secondary outgoing electrical conductor, each secondary outgoing conductor being electrically connected to a corresponding primary outgoing conductor, the corresponding outgoing conductors exhibiting an alternating voltage, and an electronic system for monitoring an electrical switchboard according to claim 1.

7. A substation for transforming an electrical intensity exhibiting a first alternating voltage into an electrical intensity exhibiting a second alternating voltage, comprising an electrical enclosure according to claim 6, an incoming switchboard comprising at least one incoming electrical conductor designed to be linked to an electrical network, the incoming conductor exhibiting the first alternating voltage, the electrical switchboard of the electrical enclosure forming an outgoing switchboard in which the corresponding outgoing conductors exhibit the second alternating voltage, and an electrical transformer connected between the incoming switchboard and the outgoing switchboard, the transformer being designed to transform the intensity exhibiting the first alternating voltage into the intensity exhibiting the second alternating voltage.

8. A method, implemented by an electronic system, for monitoring an electrical switchboard, the electronic system comprising at least one primary outgoing electrical conductor and at least one secondary outgoing electrical conductor, each secondary outgoing conductor being electrically connected to a corresponding primary outgoing conductor, the corresponding outgoing conductors exhibiting an alternating voltage, the method comprising:

monitoring, by a first electronic device, the voltage of each primary outgoing electrical conductor, monitoring only, by at least one second electronic device, the intensity of the alternating current flowing in each secondary electrical conductor, the at least one second electronic device being self-powered, wherein one of the first electronic device and the at least one second electronic device is an electronic device for monitoring an electrical quantity and includes a wireless transceiver, and a transmission module linked to the wireless transceiver, the method further including by the electronic device for monitoring an electrical quantity:

measuring at least one value of the electrical quantity, computing a plurality of monitoring parameters ($\varphi_{i,j,k}(X)$, $\|X_{i,j,k}\|$) for monitoring the electrical quantity as a function of at least one measured value of said electrical quantity, the monitoring parameters ($\varphi_{i,j,k}(X)$, $\|X_{i,j,k}\|$) including an angular phase of the electrical quantity ($\varphi_{i,j,k}(X)$) and a modulus of the electrical quantity ($\|X_{i,j,k}\|$), , and wirelessly transmitting, by the transmission module, to the other electronic device, a data message containing the at least one computed monitoring parameter ($\varphi_{i,j,k}(X)$, $\|X_{i,j,k}\|$), wherein when the angular phase ($\varphi_{i,j,k}(X)$) of the electrical quantity is computed, for each phase of index i, the computation of the angular phase ($\varphi_{i,j,k}(X)$) is made according to the equation:

$$\varphi_{i,j,k}(X) = \arctan\left(\frac{\mathrm{Im}X_{i,j,k}}{\mathrm{Re}X_{i,j,k}}\right)$$

in which $\mathrm{Re}X_{i,j,k}$, $\mathrm{Im}X_{i,j,k}$ represent real and imaginary coefficients of a Fourier series decomposition of the electrical quantity, i is the index of the corresponding phase, j is the rank of the harmonic for the Fourier series decomposition, the fundamental being of rank equal to 1, and k is an index of a voltage period $P_{voltage}$ during which the value of the electrical quantity is measured, and wherein when the modulus ($\|X_{i,j,k}\|$) of the electrical quantity is computed, for each phase of index i, the computation of the modulus ($\|X_{i,j,k}\|$) is made according to the equation:

$$\|X_{i,j,k}\| = \sqrt{\frac{(\mathrm{Re}X_{i,j,k})^2 + (\mathrm{Im}X_{i,j,k})^2}{2}}$$

in which $\mathrm{Re}X_{i,j,k}$, $\mathrm{Im}X_{i,j,k}$ represent real and imaginary coefficients of a Fourier series decomposition of the electrical quantity, i is the index of the corresponding phase, j is the rank of the harmonic for the Fourier series decomposition, the fundamental being of rank equal to 1, and k is an index of a voltage period $P_{voltage}$ during which the value of the electrical quantity is measured.

9. A system according to claim 1, wherein the at least one second electronic device is self-powered via a power supply module comprising toroids adapted to harvest magnetic energy from the flowing of the current in at least one secondary conductor.

* * * * *